United States Patent [19]
Crosby

[11] Patent Number: 5,148,162
[45] Date of Patent: Sep. 15, 1992

[54] ANALOG-TO-DIGITAL CONVERTER COMPARATOR CIRCUIT UTILIZING A REVERSE POLARITY SAMPLING TECHNIQUE

[75] Inventor: Philip S. Crosby, Portland, Oreg.
[73] Assignee: Tektronix, Inc., Wilsonville, Oreg.
[21] Appl. No.: 682,498
[22] Filed: Apr. 9, 1991
[51] Int. Cl.⁵ .............................................. H03M 1/20
[52] U.S. Cl. ................................... 341/122; 307/352
[58] Field of Search ............... 341/155, 122, 164, 165, 341/159, 127, 123, 124, 125; 307/231, 520, 236, 138, 351, 352, 353

[56] References Cited

U.S. PATENT DOCUMENTS 4,229,729 10/1980 Devendorf et al. ................ 341/159
4,764,752 8/1988 Ormond ............................ 341/155

*Primary Examiner*—A. D. Pellinen
*Assistant Examiner*—B. K. Young
*Attorney, Agent, or Firm*—John P. Dellett; Francis I. Gray

[57] ABSTRACT

An analog-to-digital converter comparator circuit includes a pair of differential amplifiers having their outputs normally intercoupled in a subtractive sense. At a sampling strobe time, the output of one differential amplifier is reversed such that outputs of the two differential amplifiers are additive. The period of time during which the output signals add can be made as short as desired, for example by successively operating differential coupling circuits at the amplifier outputs through an intervening delay line. A very small aperture time is secured which is substantially shorter than the time constant of subsequent circuitry. A latch circuit receives the output of the comparator for assuming one of two different states in accordance with the comparator sampled output.

20 Claims, 5 Drawing Sheets

ANALOG-TO-DIGITAL CONVERTER COMPARATOR CIRCUIT UTILIZING A REVERSE POLARITY SAMPLING TECHNIQUE

BACKGROUND OF THE INVENTION

The present invention relates to an analog-to-digital converter comparator circuit and particularly to such a circuit adapted for high speed operation.

Attempts are continually being made to advance the state of the art in the development of faster means of conversion from an analog signal to a digital value. In a typical analog-to-digital converter, one or more comparators receive an analog signal and produce an output relative to one or more fixed analog levels. At a given sampling time the comparison result may be applied to a bistable circuit or latch for temporarily representing the level of the analog signal. The state of the latch is then read out in generating the digital result.

The most basic factor limiting high speed performance in an analog-to-digital converter circuit is the capacitance in the circuit layout and in the active devices employed. The aperture time of the circuit, during which a sample is taken, is principally affected by the time constant of the load impedance shared by the analog-to-digital comparator and subsequent circuitry. Delays in the circuit cause the sampling to be responsive to signals that existed prior to the desired sampling time. The input signal may have been changing rapidly just prior to the sampling operation and the capacitances associated with load resistors may have been charged to extreme values at a time before a sample is to be taken.

External means such as sample and hold circuits may be employed for improving the response of the system, and various kinds of switches can be utilized, but these circuits can be expensive and complex and often generate switching transients that compromise the sampling process. Such circuitry may not provide much improvement in speed.

SUMMARY OF THE INVENTION

In accordance with the present invention, a pair of differential input amplifiers used for comparison purposes are both responsive to the same input while the amplifier outputs are connected in an opposing polarity sense so as to cancel one another. The output of at least one of said amplifiers is then inverted in response to a command such that the amplifier outputs are additive for a predetermined time period, as determined by the duration of the inversion command, or as determined by delay means providing a time difference between the response of the amplifiers to the inversion command. A very small aperture time can be secured for sampling which aperture time is substantially shorter than the time constant determined by the load impedance shared by the amplifier and subsequent circuitry. The sample output is substantially unresponsive to signals that existed prior to sampling.

It is accordingly a object of the present invention to provide an improved analog-to-digital converter element characterized by a fast sampling time.

It is another object of the present invention to provide an improved analog-to-digital converter element, the sampling time of which is substantially independent of the time constant of load circuitry.

It is a further object of the present invention to provide an improved analog-to-digital converter element that is substantially unresponsive to signals that existed prior to a sample command.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a schematic diagram of a circuit according to a first embodiment of the present invention, FIG. 2 is a schematic diagram of a circuit according to a second embodiment of the present invention, FIG. 3 of the schematic diagram of a circuit according to a third embodiment of the present invention, and FIGS. 4a–4b are schematic diagrams illustrating the FIG. 1 embodiment in greater detail, wherein a means of latching the sampled comparator signal is depicted.

DETAILED DESCRIPTION

Figure 1:
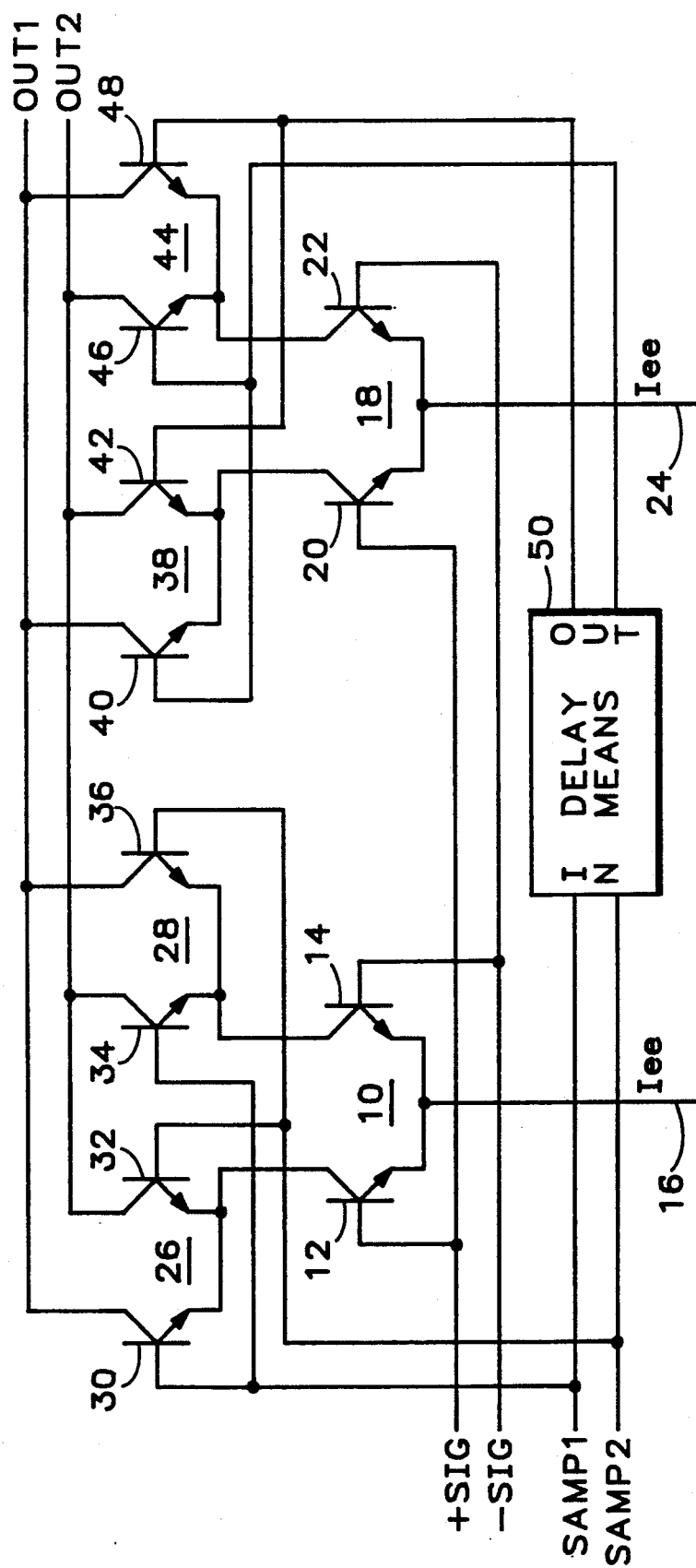

Referring to the drawings and particularly to FIG. 1, a circuit according to the present invention includes a first differential amplifier 10 comprising transistors 12 and 14 having their emitters connected in common to a current source, Iee illustrated by lead 16. A second differential amplifier 18 is similarly comprised of transistors 20 and 22 having their emitters connected in common to a current source Iee via lead 24. Both differential amplifier 10 and differential amplifier 18 receive a common input signal (designated +sig and −sig) at their respective base electrodes wherein the bases of transistors 12 and 20 are connected together to receive +sig while the bases of transistors 14 and 22 are connected together to receive −sig. The collectors of transistors 12 and 14 are respectively connected to common emitter electrodes of differential circuits 26 and 28, wherein differential circuit 26 includes transistors 30 and 32, while circuit 28 is comprised of transistors 34 and 36. The differential circuits 26 and 28 are employed to effectively multiply the collector output signals of differential amplifier 10 by +1 or −1, depending on the relative polarities of the samp1 and samp2 signals.

A differential sampling signal, samp1, samp2 is applied to the transistor bases of differential circuits 26 and 28. Samp1 is connected to the base electrodes of transistors 30 and 34, and samp2 is connected to the base electrodes of transistors 32 and 36. When samp1 is high while samp2 is low, transistors 30 and 34 are turned on whereby the differential output at the collectors of transistors 12 and 14 is applied in a first polarity sense at common output terminals out1 and out2 of the differential circuits. On the other hand, when samp2 is high and samp1 is low, transistors 32 and 36 are turned on such that the differential output from amplifier 10 is applied in a second polarity sense to terminals out1, out2. Thus, the collectors of transistors 30 and 36 are connected to out1, with the collectors of transistors 32 and 34 being connected to out2.

The differential output of amplifier 18 is similarly multiplied by a +1 or a −1 by means of differential circuits 38 and 44. Differential circuit 38 comprises transistors 40 and 42 having respective emitters connected in common to the collector of transistor 20 and collectors connected respectively to out1 and out2. Differential circuit 44 comprises a pair of transistors 46, 48 having a common emitter connection coupled to the collector of transistor 22 and collectors respectively connected to out2 and out1. The base electrodes of transistors 42 and 48 receive samp1 via delay means 50, and the base electrodes of transistors 40 and 46 receive samp2 by way of delay means 50. In a given steady state condition it will be seen that the effect of differential circuits 38 and 44 is the opposite in regard to the multiplication effect of differential circuits 26 and 28. The differential amplifiers 10 and 18 are desirably substantially identical to one another in characteristics, as are the respective differential circuits to one another, with the result being that the differential input +sig, −sig as delivered by the amplifiers 10 and 18 is substantially canceled at common output terminals out1, out2. However, when the sampling signal is reversed or inverted at the time of a sampling command or strobe, the status of differential circuits 26 and 28 is reversed before the status of differential circuits 38 and 44 is reversed. Assuming samp2 is high and samp1 is low in the steady state condition, it will be seen that +sig is applied to out2 by means of transistor 32, while −sig is applied to terminal out1 employing transistor 36. As hereinbefore explained, differential pairs 38, 44 accomplish the opposite effect. When samp1 goes high and samp2 goes low, +sig is applied by transistor 30 to terminal out1 and −sig is coupled to terminal out2 by way of transistor 34 for producing a momentary addition to the outputs provided by transistors 40 and 46 at output terminals out1, out2. When the reversal command traverses delay means 50, the outputs from amplifier 18 as delivered by differential circuits 38, 40 is also reversed, again resulting in cancellation. The intervening period of time is determined by the delay produced by delay means 50 which controls the sampling period of the circuit.

The sampling period of the FIG. 1 circuit can be made as small as desired since it is set by delay means 50. In a particular example, delay means 50 comprised a delay line 0.5 nanoseconds long. The effect of the load impedance as may be otherwise connected to output terminals out1 and out2 is minimized. The circuit according to the present invention provides the ability to in effect decouple the apparent sampling aperture time from the load impedance. Assuming a latch circuit (for example as hereinafter more fully described) is connected to terminals out1, out2, and the signal +sig is greater than the signal −sig at the sampling time when the strobe edge is applied (i.e., the reversal of samp1 and samp2) then the latch will assume a first stable state. If, on the other hand, −sig is greater than +sig at the time the strobe edge is applied, then the latch will assume the opposite stable state. The aperture time of sampling can be substantially shorter than the time constant of the load impedance shared by the amplifiers and the subsequent latch circuitry.

Figure 2:
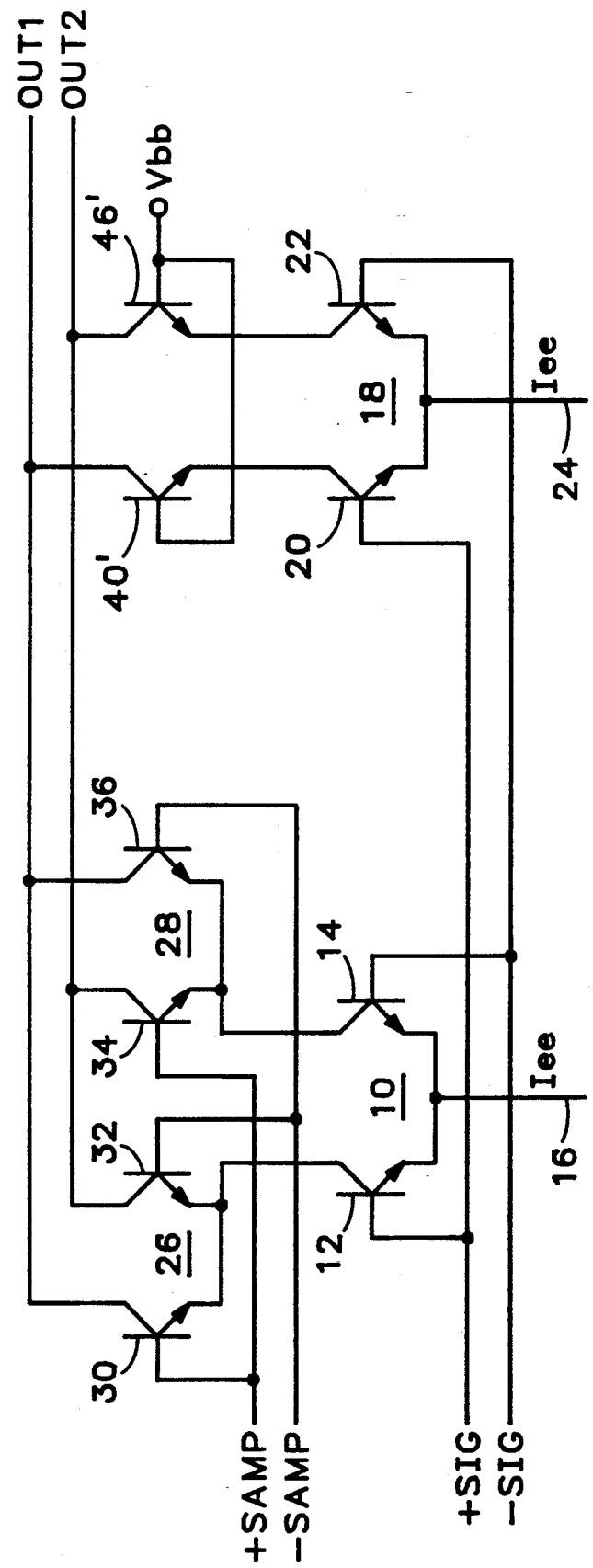

Referring now to FIG. 2 a further embodiment of the circuit according to the present invention is illustrated wherein like components are identified by corresponding reference numerals. In this circuit, amplifiers 10 and 18 are identical to those of the FIG. 1 embodiment, and similarly differential circuits 26 and 28 delivering the output of amplifier 10 to terminals out1 and out2 are the same as in the FIG. 1 circuit. However, in this embodiment, the output of transistor 20 is permanently coupled to out1 by having its collector electrode connected to the emitter of a first transistor 40' the collector of which is connected to out1. The collector of transistor 22 is permanently coupled to out2 via the emitter-collector path of transistor 46'. A bias voltage, Vbb is delivered to the base electrodes of transistors 40' and 46' to enable conduction. It will be assumed that lead −samp is normally up while +samp is normally down such that the output at the collector of transistor 12 representing +sign is delivered to terminal out2 and the input −sig is delivered at terminal out1. Meanwhile, +sig is coupled to terminal out1 and −sig is coupled to terminal out2 by way of amplifier 18. The result is substantial cancellation of the outputs of amplifiers 10 and 18 at terminals out1 and out2. At sampling time, the differential sampling signal +samp, −samp is inverted for a short predetermined period of time whereupon transistors 30 and 34 are caused to conduct. It will be seen the signals delivered at terminals out1 and out2 are now additive. In this embodiment, the length of the sampling interval is determined by the width of the sample pulse, i.e., the duration of the time period during which +samp is up and −samp is down. Of course, this sample pulse can be very brief on the order of a few nanoseconds.

Figure 3:
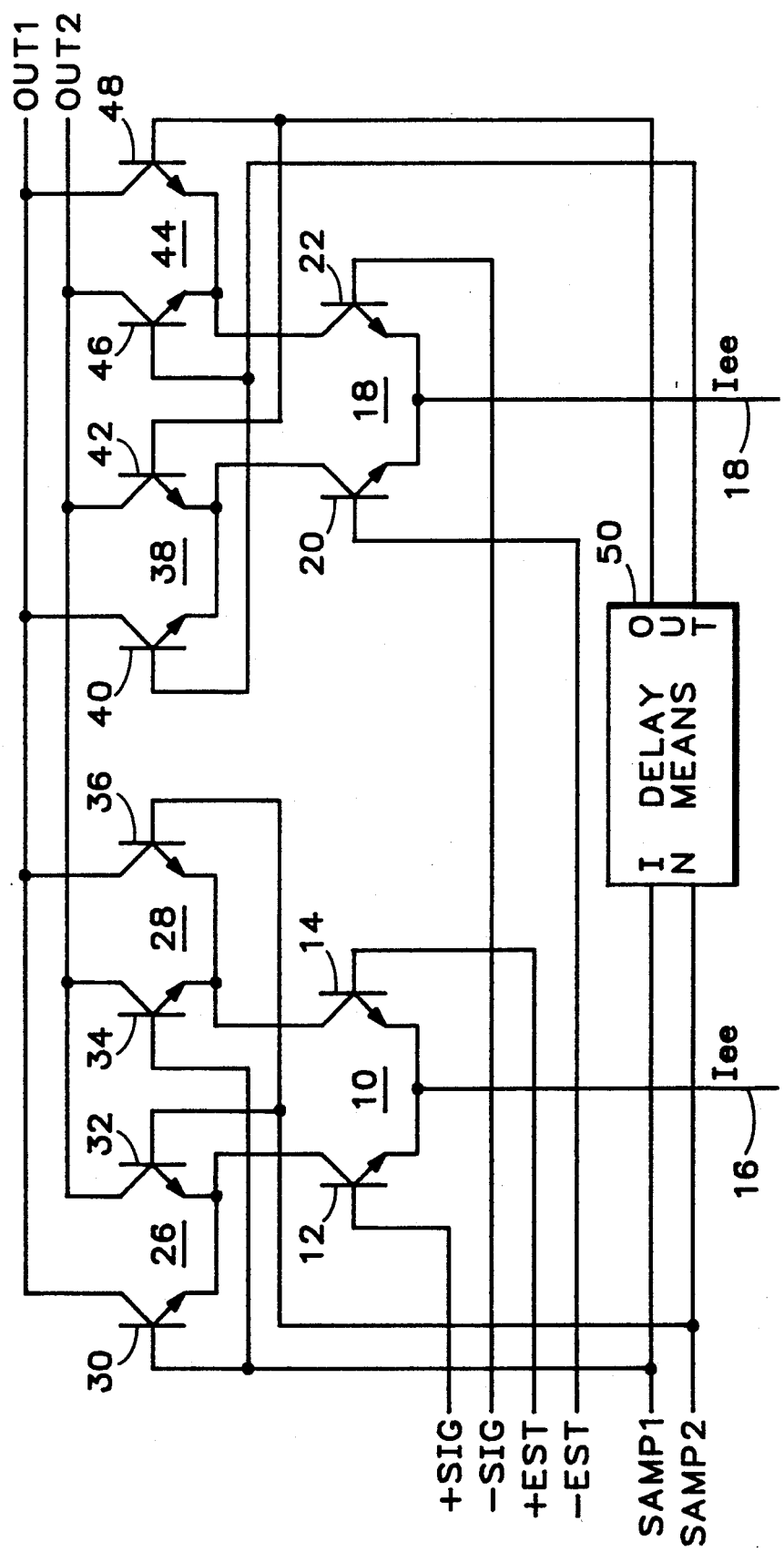

A third embodiment of the present invention as illustrated in FIG. 3 corresponds generally to the FIG. 1 embodiment and like reference numerals refer to like components. In this embodiment, the comparator additionally subtracts the input signal from an estimate of the signal in the manner of successive approximation converters. In such converters, a signal is subtracted that represents the present best estimate of the signal. The signal can be determined in value according to a straightforward successive approximation algorithm. In this embodiment, +sig is coupled to the base of transistor 12 of differential amplifier 10 while +est, representing the estimate, is applied to the base of transistor 14. At the same time, −sig is coupled to the base of transistor 22 of differential amplifier 18 while −est is applied to the base of transistor 20. Otherwise, the circuit operates in the same manner as described in connection with the FIG. 1 embodiment, with an inversion of the differential sampling signal, samp1, samp2, at the desired sampling time for first inverting the output from differential amplifier 10 and then inverting the output of differential amplifier 18.

Figure 4A:
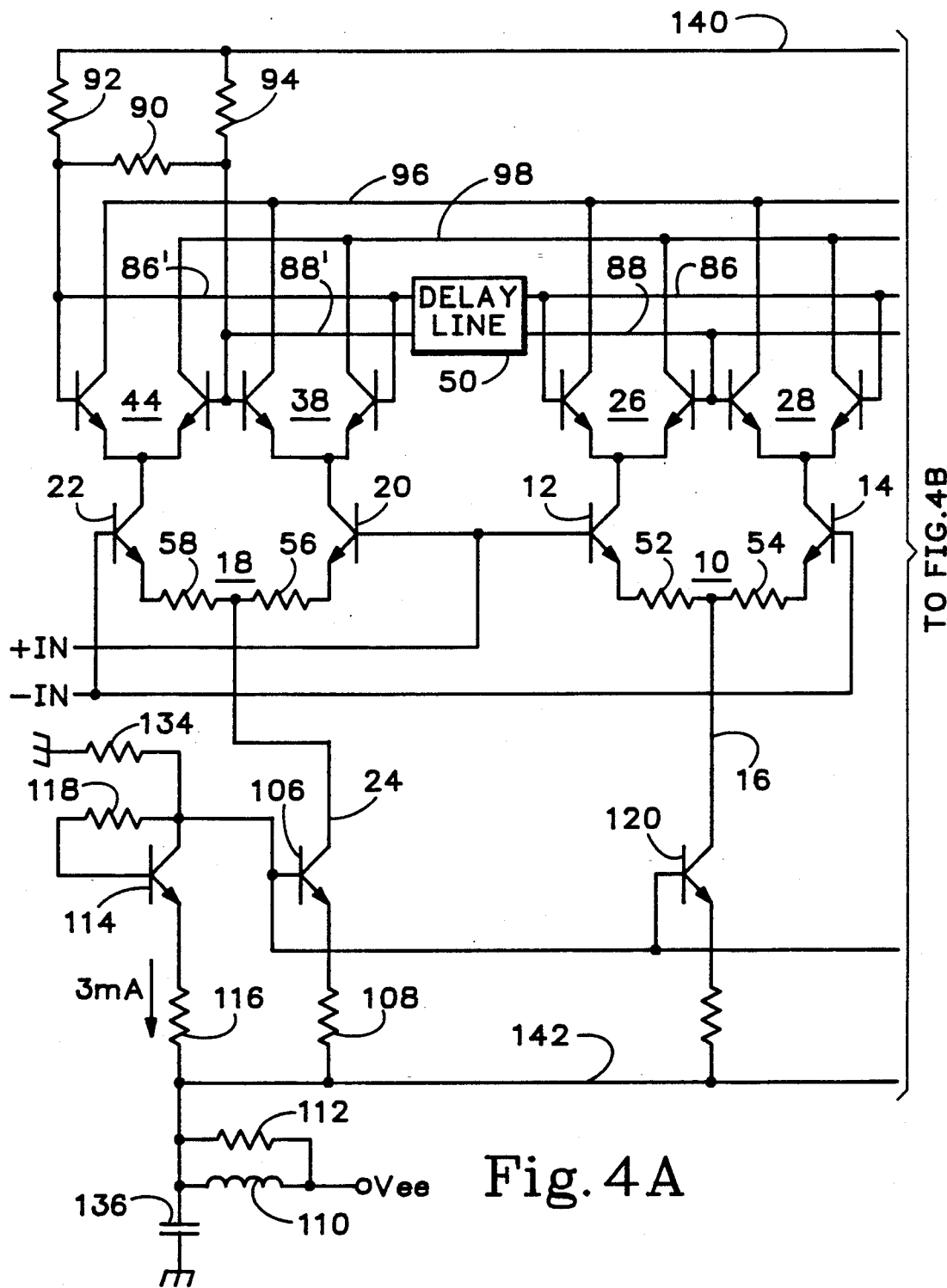
Figure 4B:
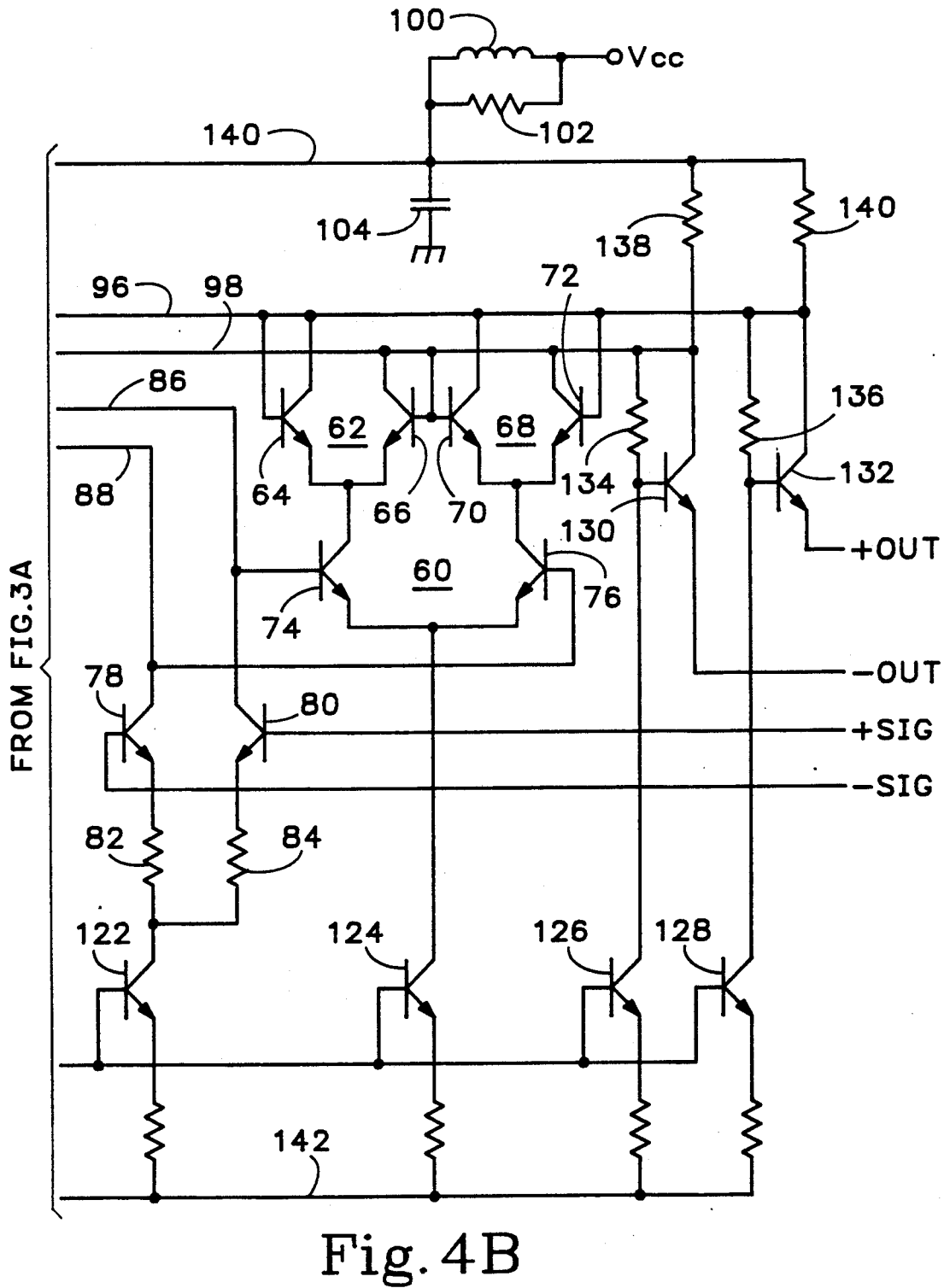

A circuit according to the FIG. 1 embodiment is illustrated in greater detail in FIGS. 4a-4b, wherein like components are identified with corresponding reference numerals. A differential input signal, designated +in, −in, is applied to differential amplifiers 10 and 18 in such manner that in the steady state condition the outputs thereof are canceled at bus 96, 98 through action of differential circuits 26, 28, 38, 44 as hereinbefore described. In this version, the emitters of identical differential amplifier transistors 12 and 14 are connected to current lead 16 through emitter resistors 52 and 54 respectively, said resistors having substantially the same resistance value. Also, the emitters of identical transistors 20 and 22 are returned to current lead 24 through resistors 56 and 58 having substantially the same value. The sampling signal (corresponding to samp1, samp2 in FIG. 1) is applied first to differential circuits 26, 28, and then after a delay produced by delay line 50 to differential circuits 38 and 44 according to the operation of a differential switching circuit comprising transistors 78 and 80 respectively receiving −str (minus strobe) and +str (plus strobe) at their base terminals. The emitters of transistors 78 and 80 are coupled to the collector of current source transistor 122 through emitter resistors 82 and 84, while the collectors of transistors 78 and 80 drive the base electrodes of the transistors of differential circuits 26 and 28 through line conductors 86, 88. Line conductors 86 and 88 also drive delay line 50. Line conductors 86', 88' beyond delay line 50 drive the base electrodes of transistors of differential circuits 38 and 44 and are terminated at resistor 90 disposed in shunt relation to the line.

A first resistor 92 connects line 86' to a source of voltage, VCC, through the parallel combination of choke 100 and resistor 102, wherein the junction 140 between resistor 92 and choke 100 is coupled to ground through filter capacitor 104. Also, resistor 94 is interposed between line 88' and junction 140. The load resistors 92 and 94 provide collector current to switch transistors 78 and 80.

A current source for the emitters of transistors 20 and 22 of differential amplifier 18 is provided by transistor 106 having its collector connected to lead 24 and its emitter returned to junction 142 through resistor 108. Junction 142 is connected to a relatively negative voltage source, Vee, through the parallel combination of choke 110 and resistor 112, and is returned to ground through filter capacitor 136. A transistor 114 has its collector connected to the base of transistor 106 and is coupled to ground through resistor 134. A resistor 116 is interposed between the emitter of transistor 114 and junction 142. A constant current flows through transistor 114 maintaining a constant voltage level at the base of transistor 106, as well as at the base electrodes of transistors 120, 122, 124, 126 and 128. Transistor 106 provides a constant source of current on lead 24 to differential amplifier 18. In similar fashion, transistor 120 supplies a constant current on lead 16, and transistor 122 supplies a constant current to the emitters of transistors 78 and 80.

The circuit as illustrated in FIGS. 4a-4b additionally includes a latch circuit 60 which is responsive to the comparator comprising the differential amplifiers 10, 18 whose outputs are delivered through the differential circuits 26, 28, 38, 44 on the bus comprising common output leads 96, 98. The latch circuit 60 in the illustrated embodiment is of the type set forth and claimed in the co-pending U.S. Pat. application Ser. No. 07/682,775 filed Apr. 9, 1991 by Clifford H. Moulton and Philip S. Crosby entitled ANALOG-TO-DIGITAL CONVERTER LATCH CIRCUIT now abandoned. This circuit is adapted to assume one of two stable states in accordance with the comparator output as delivered on bus 96, 98. It is further adapted to reduce the effect of the time constant of the load impedance, here comprising resistors 138 and 140 respectively interposed between junction 142 and bus leads 98 and 96.

The latch 60 comprises a first degenerative portion 62 including transistors 64 and 66, as well as a second regenerative portion 68 comprising transistors 70 and 72. The emitters of transistors 64 and 66 are connected in common to the collector of transistor 74 having its emitter returned to the collector of a current source transistor 124. Also, the emitters of transistors 70 and 72 are coupled to the collector of transistor 124 through the collector-emitter path of transistor 76. Transistors 74 and 76 comprise a current switch for alternately operating the degenerative circuit portion 62 or the regenerative circuit portion 68.

The collector and base of transistor 64 are coupled to lead 96, with the collector and base of transistor 66 being coupled to lead 98. The collector of transistor 70 and the base of transistor 72 are coupled to lead 96, while the collector of transistor 72 and the base of transistor 70 are coupled to lead 98. During steady state conditions, i.e., when −str is up and +str is down, it will be seen that transistor 74 is conducting whereby the degenerative circuit 62 is functional. The heavy degeneration provided thereby holds the lines 96 and 98 at a neutral, pre-strobe level. At the strobe or sampling time, +str goes up and −str goes down whereby the regenerative circuit 68 is activated because of conduction through transistor 76. Hence, since the collector of transistor 70 is coupled to the base of transistor 72, and the collector of transistor 72 is connected to the base of transistor 70, the circuit 68 will rapidly assume a condition wherein either transistor 70 or 72 conducts depending upon the relative values then present on leads 96 and 98.

At strobe time, the outputs of differential circuits 26 and 28 switch so as to be in additive relation with the outputs supplied by differential circuits 38 and 44, as described in reference to the embodiment of FIG. 1, until the output of delay line 50 also reverses the outputs supplied by differential circuits 38 and 44. During this short period of time, the relative levels on leads 96 and 98 are effective for rapidly determining the condition of latch portion 68, i.e., whether transistor 70 or transistor 72 conducts.

The output then present on lines 96 and 98 is coupled to terminals +out and −out via isolating transistors 130 and 132 having their collector electrodes respectively connected to lines 98 and 96 and their emitter electrodes respectively connected to terminals −out and +out. The collector electrode of transistor 130, in addition to being connected to common load resistor 138, is also coupled to the base of transistor 130 through resistor 134 further returned to the collector of current source transistor 126. The collector of transistor 132, in addition to being connected to common load resistor 140, is also connected to the base of transistor 132 through resistor 136 connected in common with the collector of current source transistor 128. The sampling time of the FIG. 4 circuit can be very short and the circuit is substantially unresponsive to signals that existed prior to sampling time.

Although the term amplifier is used hereinabove and in the following claims, this term does not necessarily imply that the circuit to which reference is made has a gain of more than one, one or less than one.

While preferred embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. An A/D converter element for sampling an input signal, said element comprising:
   first means for receiving an input comparison signal,
   second means for receiving said input comparison signal,
   means for normally combining outputs of said first means and said second means subtractively,
   means for producing inversion in operation between said first means and said second means for a predetermined time period during which said outputs combine additively, and latch means for receiving said combined output and responding thereto for assuming a stable state in accordance with said comparison signal.

2. The converter element according to claim 1 wherein said means for producing inversion for a predetermined time period includes delay means, said first means being responsive to an inversion command for first inverting its output whereby the outputs of said first means and said second means become additive, said second means being responsive to said inversion command as delayed by said delay means so that said outputs again combine subtractively.

3. An A/D converter element for sampling an input signal, said element, comprising:
   first means responsive to an input signal for providing a first output in a first polarity,
   second means responsive to said input signal for providing a second output signal in a second polarity and in substantial opposition to said first output, and
   means for reversing the polarity of output of one of said first and second means to provide a combined output signal representing said input signal.

4. The converter element according to claim 3 wherein said reversing means, after reversing the polarity of output of said one of said first and second means, then reverses the polarity of output of the remaining one of said first and second means.

5. The converter element according to claim 3 wherein said reversing means reverses the polarity of output of said one of said first and second means for a predetermined period of time.

6. An A/D converter element for sampling an input analog signal, said element comprising:
   a first amplifier for receiving said input signal,
   a second amplifier for receiving the same input signal, and
   means for coupling the outputs of said first and second amplifiers normally substractively so that the output of said second amplifier substantially cancels the output of said first amplifier, said coupling means being operable for reversing the polarity of at least one of said outputs for a predetermined time interval to provide an output that is the addition of the outputs of the first and second amplifiers.

7. The converter element according to claim 6 wherein said means for coupling said outputs comprises:
   first and second differential circuits for receiving outputs of said first amplifier,
   third and fourth differential circuits for receiving outputs of said second amplifier,
   means for providing outputs of said first, second, third and fourth differential circuits to common output terminals, and
   means for operating said differential circuits for combining outputs first substractively and then additively by first operating elements of said first and second differential circuits to connect outputs of said first amplifier to said common output terminals in a first polarity while operating elements of said third and fourth differential circuits to connect outputs of said second amplifier to said common output terminals in a second polarity, followed by reversing operation of said elements of said first and second differential circuits so that the outputs of both amplifiers are delivered to said common output terminals in said second polarity.

8. The converter element according to claim 7 wherein said first and second amplifiers each comprise a differentially connected pair of active elements.

9. The converter element according to claim 8 wherein each said differentially connected pair of active elements comprises a pair of transistors having a common emitter connection.

10. The converter element according to claim 9 wherein each of said differential circuits comprises a differentially connected pair of active elements.

11. The converter element according to claim 10 wherein said elements of each said differential circuit comprise a first transistor and a second transistor having a common emitter connection with the first transistor, said common emitter connection being coupled to a collector of a said amplifier.

12. The converter element according to claim 7 wherein said means for operating said differential circuits comprises delay means for providing a signal for controlling said elements of said third and fourth differential circuits for reversing operation thereof after providing said signal for controlling said elements of said first and second differential circuits to reverse operation thereof.

13. The converter element according to claim 12 wherein said first and second amplifiers each comprise a differentially connected pair of active elements,
   wherein each said differentially connected pair of active elements comprises a pair of transistors having a common emitter connection,
   wherein each said differential circuit comprises a differentially connected pair of active elements,
   wherein said elements of each said differential circuit comprise a first transistor and a second transistor having a common emitter connection with the first transistor, said common emitter connection being coupled to a collector of said amplifier, and
   wherein said delay means is interposed between base terminals of said first and second differential circuit transistors and said third and fourth differential circuit transistors, first base terminals of transistor elements of said first and second differential circuits being coupled to a first input terminal of said delay means, second base terminals of transistor elements of said first and second differential circuits being coupled to a second input terminal of said delay means, second base terminals of transistor elements of said third and fourth differential circuits being coupled to a first output terminal of said delay means, and first base terminals of transistor elements of said third and fourth differential circuits being coupled to a second output terminal of said delay means.

14. The converter element according to claim 7 further comprising a latch circuit operatively connected to said common output terminals and adapted to assume a stable state in response to the relative voltage provided at said common output terminals.

15. The converter element according to claim 6 wherein said means for coupling said outputs comprises:
   first and second differential circuits for receiving outputs of said first amplifier,
   a third circuit for receiving the outputs of said second amplifier,
   means for providing outputs of said first, second and third circuits to common output terminals, and
   means for operating said first, second and third circuits for combining outputs first subtractively and then additively by first operating elements of said first and second differential circuits to connect outputs of said first amplifier to said common output terminals in a first polarity while operating elements of said third circuit to connect outputs of said second amplifier to said common output terminals in a second polarity, followed by reversing operation of said elements of said first and second differential circuits so that the outputs of both amplifiers are delivered to said common output terminals in said second polarity.

16. The converter element according to claim 15 wherein said first and second amplifiers each comprise a differentially connected pair of active elements.

17. The converter element according to claim 16 wherein each said differentially connected pair of active elements comprises a pair of transistors having a common emitter connection.

18. The converter element according to claim 17 wherein each of said first and second differential circuits comprises a differentially connected pair of active elements.

19. The converter element according to claim 18 wherein said elements of each said differential circuit comprise a first transistor and a second transistor having a common emitter connection with the first transistor, said common emitter connection being coupled to a collector of said first amplifier.

20. The converter element according to claim 15 further comprising a latch circuit operatively connected to said common output terminals and adapted to assume a stable state in response to the relative voltage provided at said common output terminals.

* * * * *